United States Patent
Ueda

(10) Patent No.: US 7,989,913 B2
(45) Date of Patent: Aug. 2, 2011

(54) SEMICONDUCTOR DEVICE AND METHOD FOR CUTTING ELECTRIC FUSE

(75) Inventor: Takehiro Ueda, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 142 days.

(21) Appl. No.: 11/798,221

(22) Filed: May 11, 2007

(65) Prior Publication Data

US 2007/0262357 A1 Nov. 15, 2007

(30) Foreign Application Priority Data

May 15, 2006 (JP) .................................. 2006-135622

(51) Int. Cl.
*H01L 29/68* (2006.01)
*H01L 27/148* (2006.01)

(52) U.S. Cl. ........ 257/529; 257/209; 257/249; 257/665; 257/E23.149

(58) Field of Classification Search .................. 257/249, 257/529, 209, 665, E23.149
See application file for complete search history.

(56) References Cited

U.S. PATENT DOCUMENTS

| 4,064,493 | A | 12/1977 | Davis | |
|---|---|---|---|---|
| 2004/0262710 | A1* | 12/2004 | Ueda | 257/529 |
| 2005/0179062 | A1* | 8/2005 | Kajita | 257/209 |
| 2005/0285222 | A1* | 12/2005 | Thei et al. | |

FOREIGN PATENT DOCUMENTS

| JP | 2004-186590 | 7/2004 |
|---|---|---|
| JP | 2004-214580 | 7/2004 |
| JP | 2005-39220 | 2/2005 |
| JP | 2005-57186 | 3/2005 |

OTHER PUBLICATIONS

Chinese Office Action in the corresponding Chinese patent application 200710103283.2, issued on Oct. 24, 2008.

* cited by examiner

*Primary Examiner* — Hung Vu
*Assistant Examiner* — Vernon P Webb
(74) *Attorney, Agent, or Firm* — Young & Thompson

(57) ABSTRACT

An electric fuse includes: a first interconnect and a second interconnect, formed on a semiconductor substrate; a fuse link, formed on the semiconductor substrate and provided so that an end thereof is coupled to the first interconnect, the fuse link being capable of electrically cutting the second interconnect from the first interconnect; and an electric current inflow terminal and an electric current drain terminal for cutting the fuse link, formed on the semiconductor substrate and provided in one end and another end of the first interconnect, respectively.

17 Claims, 10 Drawing Sheets

6B

SEMICONDUCTOR DEVICE AND METHOD FOR CUTTING ELECTRIC FUSE

This application is based on Japanese patent application No. 2006-135,622, the content of which is incorporated hereinto by reference.

BACKGROUND

1. Technical Field

The present invention relates to a semiconductor device and a method for cutting electric fuse, and particularly relates to a semiconductor device including an electric fuse and a method for cutting such electric fuse.

2. Related Art

A technology is conventionally known, in which a fuse is mounted in a semiconductor device, and the fuse is cut, so that a value of a resistor employed in the semiconductor device is suitably adjusted, or a failure element is separated and replaced into a normal element.

Typical manner for cutting a fuse includes cutting a fuse by irradiating a laser beam in a portion of the fuse and cutting a fuse by applying an electric current.

U.S. Pat. No. 4,064,493, Japanese Laid-open patent publication No. 2005-39,220 and Japanese Laid-open patent publication No. 2005-57,186 disclose an electric fuse, which is capable of being cut by utilizing a phenomenon, in which a material constituting the electric fuse migrates by an electromigration.

Japanese Laid-open patent publication No. 2005-39,220 discloses an electric fuse, which is breakable with a smaller current. In Japanese Laid-open patent publication No. 2005-39,220, an electric conductor constituting an electric fuse is formed to have a geometry that the conductor is turned back for several folds. FIG. 9 is a plan view, showing an electric fuse disclosed in Japanese Laid-open patent publication No. 2005-39,220. In this case, a fuse 1100 includes two folds of turn-back.

The fuse 1100 includes a current inflow terminal 1101 and a current drain terminal 1102, and further includes a first forward path straight line 1103, a return path straight line 1104 and a second forward path straight line 1113 between both of the terminals. The fuse 1100 further includes a first perpendicular coupling portion 1106, which provides a coupling between the first forward path straight line 1103 and the return path straight line 1104, and a second perpendicular coupling portion 1107, which provides a coupling between the second forward path straight line 1113 and the return path straight line 1104. When a predetermined current is supplied from current inflow terminal 1101 into current drain terminal 1102 in the fuse 1100 having the above-described configuration, the heats generated in the hatched portions 1108 outside of the fuse 1100 are added to the heats generated in the hatched portions 1109 inside of the fuse 1100, accelerating the cutting of the return path straight line 1104 sandwiched with the hatched portions 1109. This provides easily cutting the fuse 1100.

Moreover, Japanese Laid-open patent publication No. 2005-57,186 has disclosed a configuration in which, when a current is flowed in a fuse, heat generated in a portion of the fuse, which is to be cut, is trapped or accumulated in the neighborhood of the portion in the fuse, which is to be cut, by enclosing the portion with a plate.

Japanese Laid-open patent publication No. 2004-186,590 discloses a semiconductor device, which is provided with an electrically conducting layer and an insulating film formed in this order in or above a semiconductor substrate, and also provided with a connecting hole that extends through the insulating film and reaches an upper surface of the conducting layer. The semiconductor device includes an interconnect layer, which includes a flat portion formed on the insulating film and a curved portion formed integrally with the flat portion and formed on a side surface and a bottom surface of the connecting hole, the curved portion defining a hollow portion that has a geometry tapered toward an upside thereof. In this case, a geometry of the interconnect layer formed in the connecting hole is curved, and have a reduced thickness in the lower portion of the connecting hole. The structure of such interconnect layer is a fuse element structure, and a resistivity thereof is increased as the thickness is reduced, so that a minimum current value for cutting an electrical coupling between the lower interconnect layer and the overlying interconnect layer can be reduced. It is described that such configuration provides a simultaneous pursuit of a suitable fuse element structure, which is capable of being cut with a smaller current density, and a suitable multiple-layered interconnect structure.

Japanese Laid-open patent publication No. 2004-214,580 discloses a layout of a fuse for providing an improved production yield and reliability by reducing a defective cutting of a fuse. A fuse layout described in Japanese Laid-open patent publication No. 2004-214,580 is shown in FIG. 10. In a fuse layout 1010, which is composed of an interconnect electrode having a barrier metal layer composed of a refractory metal and a principal interconnect metallic layer, a plurality of meltdown type fuse units 1011 and 1012 that are connected in series are formed. In addition, a fuse pad 1013 is formed in one end of the fuse unit 1011, a fuse pad 1014 is formed in a coupling portion of the fuse unit 1011 and the fuse unit 1012, and a fuse pad 1015 is formed in the other end of the fuse unit 1012. In order to flow an electric current through the fuse unit 1011, an electrical voltage is applied across the fuse pad 1013 and the fuse pad 1014. In order to flow an electric current through the fuse unit 1012, an electrical voltage is applied across the fuse pad 1014 and the fuse pad 1015. If at least one of the plurality of fuse units is broken in such fuse layout 1010, this is equivalent that the whole layout is cut, and therefore rate of occurring a defective cutting can be greatly reduced.

The present inventor has recognized as follows. As described above, the cutting of the conventional electric fuse is generally achieved by applying an electrical voltage across the both ends of the fuse link to be cut to achieve a passage of an electric current through the fuse link. Nevertheless, when an electric current is applied to a fuse link to break thereof, an incomplete cutting of the fuse link is often caused to occur a defective cutting. If such defective cutting of a fuse link is occurred, the electric fuse acquires a lukewarm electric resistance. Therefore, a problem is caused, in which a decision circuit decided that the fuse is not cut, in case that it must be decided that the fuse is cut. On the other hand, since the electric fuse acquires an increased electric resistance, a level of an electric current that requires for cutting the fuse can not be flowed when an electric current is flowed once again to break the fuse link.

SUMMARY

According to the present invention, there is provided a semiconductor device, including: a semiconductor substrate; a first interconnect and a second interconnect, formed on the semiconductor substrate; a fuse link, formed on the semiconductor substrate and provided so that one end thereof is coupled to the first interconnect, the fuse link being capable of electrically disconnecting the second interconnect from the first interconnect; and an electric current inflow terminal and an electric current drain terminal for cutting the fuse link, formed on the semiconductor substrate and provided in one end and another end of the first interconnect, respectively.

Here, the fuse link may be configured that one end thereof is coupled to a region between the electric current inflow terminal and the electric current drain terminal of the first interconnect. More specifically, the fuse link may be configured to be branched off from the first interconnect. The fuse link is configured that one end and another end thereof are provided to be coupled to the first interconnect and the second interconnect, respectively, thereby connecting these interconnects in the condition before cutting the fuse link. On the other hand, the fuse link is configured that at least one end thereof is coupled to the first interconnect, thereby cutting the electrical coupling between the first interconnect and the second interconnect in a condition after cutting the fuse link. In the present invention, the electric fuse is composed of the fuse link, the first interconnect, the electric current inflow terminal and the electric current drain terminal.

The first interconnect, the second interconnect and the fuse link are composed of electric conductors. The fuse link may be configured to be more easily cut than the first interconnect. In the present invention, an electrical voltage is applied between the electric current inflow terminal and the electric current drain terminal to provide a passage of an electric current through the first interconnect, so that the first interconnect is heated to cause a deformation of the electric conductor constituting the first interconnect, causing a migration of the electric conductor constituting the fuse link toward the direction to the first interconnect, thereby cutting the fuse link.

The present inventor has found a novel technique for cutting electric fuses, in which a constitution of an electric fuse or a manner for applying an electric voltage to an electric fuse is suitably controlled, so that a part of an electric conductor that constitutes an electric fuse is forced to be flowed toward outside of the electric fuse leading to losing a balance between a migration and a supply of the electric conductor material, thereby forming a larger cut part in other part when the electric fuse is cut or broken. This allows maintaining an improved condition in cutting or breaking of a cut electric fuse. In the present invention, the cutting of the fuse link is achieved by utilizing such cutting mechanism. More specifically, first of all, an electrical voltage is applied to the first interconnect, causing the electric conductor constituting the first interconnect flowing toward outside thereof. Here, the term "outside" may be construed as an outside of a region where the first interconnect is formed in a condition before cutting the fuse link, and may be construed as, for example, an outside of an interconnect trench where the first interconnect is formed. As a result, the electric conductor constituting the fuse link is drawn out toward the first interconnect, creating a cut part in the fuse link.

Having this configuration, an electrical voltage for cutting the fuse link is applied to the first interconnect, instead of the fuse link which is to become the cut part. Therefore, even when an electrical voltage is once applied between the electric current inflow terminal and the electric current drain terminal for cutting the fuse link to cause a partial cutting of the fuse link and thus cause a defective cutting, an electrical voltage may be once again applied between the electric current inflow terminal and the electric current drain terminal, so that a retrial for cutting the fuse link can be achieved. In other words, even in a status that the fuse link is cut, the first interconnect is not cut. Therefore, an electrical potential having same voltage as applied for the first time can also be applied to the first interconnect over any number of times, thereby ensuring the cutting of the fuse link.

According to the present invention, there is provided a method for cutting an electric fuse that includes a fuse link having one end and another end, which are provided to be coupled to a first interconnect and a second interconnect, respectively, on semiconductor substrate, including: applying a predetermined electric voltage across both ends of the first interconnect to apply an electric current to the first interconnect, thereby allowing an electric conductor that constitutes the first interconnect flowing from the first interconnect toward outside thereof, and thereby an electric conductor that constitutes the fuse link is migrated toward the first interconnect to form a void region in the fuse link.

Having such procedure, even in the case that an electrical voltage is once applied to both ends of the first interconnect so that the fuse link is partially cut to generate a defective cutting, the first interconnect is not cut. Therefore, an electrical potential having same voltage as applied for the first time can also be applied to the first interconnect over any number of times, thereby ensuring the cutting of the fuse link.

Moreover, since the electric conductor that constitutes the electric fuse is flowed from the first interconnect toward outside thereof in the cutting condition to form a void region in the fuse link according to the method for cutting an electric fuse of the present invention, larger void region can be formed as a cut part. Further, since the void region is provided in a location that is different from the location where the electric conductor is flowed out, a possibility of a reconnection of the cut electric fuse can be considerably reduced. This allows maintaining an improved condition in cutting of a cut electric fuse.

According to the present invention, there is provided a method for manufacturing a semiconductor device, including: selecting an electric fuse to be cut; and cutting the selected electric fuse via the above-described method for cutting an electric fuse.

According to the present invention, a retrial of an operation for cutting an electric fuse can be achieved.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 6A and 6B are schematic plan views, showing a configuration of the electric fuse in an embodiment according to the present invention;

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
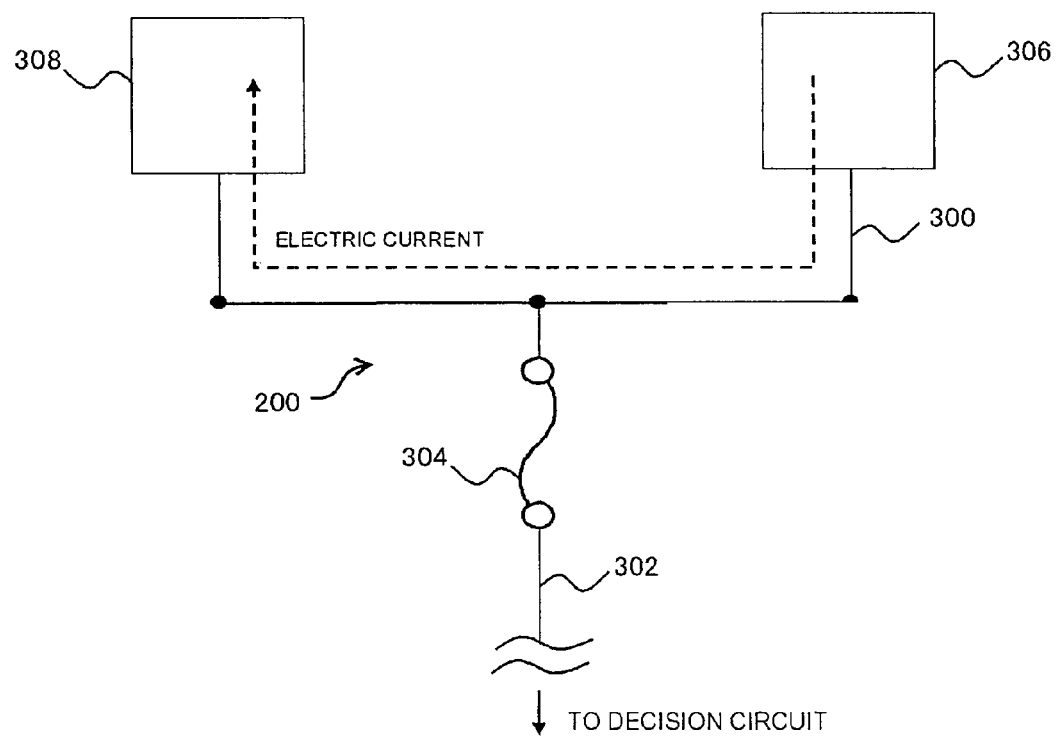
FIG. 1 is a layout diagram, showing a configuration of an electric fuse in an embodiment according to the present invention.

FIG. 1 is a layout diagram, showing a configuration of an electric fuse 200 in the present embodiment. The electric fuse 200 is composed of a fuse link 304, a first interconnect 300 coupled to one end of the fuse link 304, and an electric current inflow terminal 306 and an electric current drain terminal 308 formed in one end and another end of the first interconnect 300, respectively. The fuse link 304 is provided between the first interconnect 300 and the second interconnect 302, and functions as creating an electrical coupling or cutting between the first interconnect 300 and the second interconnect 302. In a condition before cutting the fuse link, another end of the fuse link 304 is coupled to the second interconnect 302. Though it is not shown here, the fuse link 304, the first interconnect 300, the electric current inflow terminal 306, the electric current drain terminal 308 and the second interconnect 302, are formed on a semiconductor substrate.

In the present embodiment, the fuse link 304 is cut by applying an electrical voltage between the electric current inflow terminal 306 and the electric current drain terminal 308 to cause a flow of an electric current through the first interconnect 300. In the present embodiment, a passage of an electric current through the first interconnect 300 is created, so that the first interconnect 300 is heated to cause a deformation of an electric conductor constituting the first interconnect 300, causing a migration of an electric conductor constituting the fuse link 304 toward the direction to the first interconnect 300, thereby cutting the fuse link 304. This allows the second interconnect 302 being electrically cut from the first interconnect 300.

Figure 10:
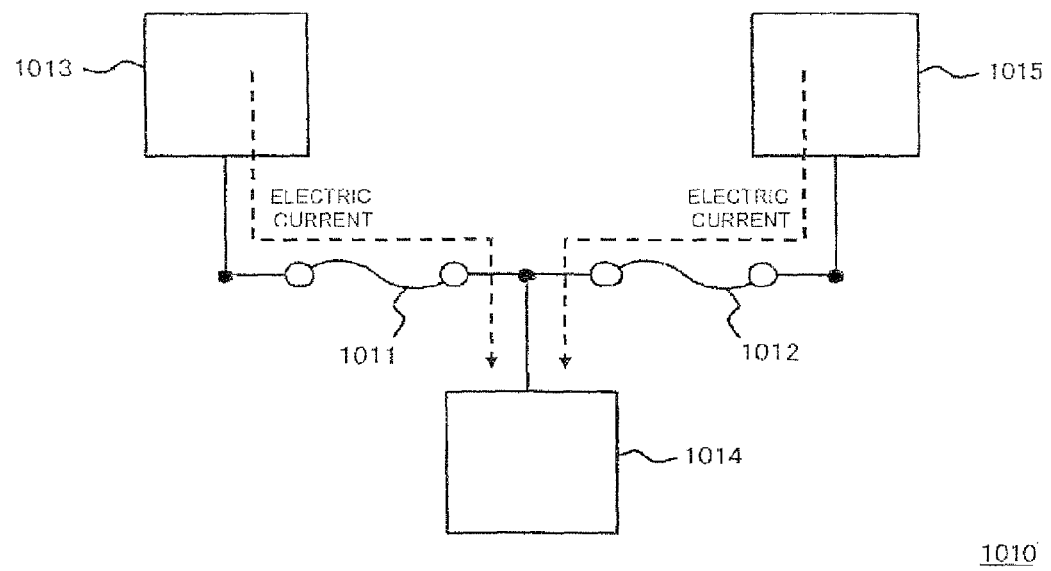
FIG. 10 is a layout of a conventional electric fuse.

More specifically, in the electric fuse 200 in the present embodiment, the fuse link 304 to be cut is not applied with an electric current for cutting the fuse link 304. In this regard, the manner thereof is different from the conventional fuse layout 1010 shown in FIG. 10. In the conventional manner, an electric current is flowed in the fuse unit 1011 and fuse unit 1012 to be cut to break these fuse units. On the contrary, in the electric fuse 200 of the present embodiment, in stead of flowing an electric current through the fuse link 304 to be cut, an electric current to cut the fuse link 304 is flowed in an interconnect that is different from the fuse link 304 and is coupled to the fuse link 304 (first interconnect 300). More specifically, the first interconnect 300 in which an electric current is flowed can not be cut, even in the cutting condition. This allows applying an electrical current having same current value as applied for the first time to the first interconnect 300, even if the cutting of fuse link 304 is once attempted, and the fuse link 304 is partially cut. More specifically, by flowing an electric current through the first interconnect 300, a retrial for cutting the fuse link 304 can be achieved over any number of times.

In the next, a mechanism for cutting the electric fuse 200 in the present embodiment will be described. In the present embodiment, the electric fuse 200 is cut via a "crack assist type" process. In addition to above, the electric fuse, which is capable of being cut via a crack assist type process, may be configured to be formed in an insulating film. In the present embodiment, the electric conductor that constitutes the electric fuse may be composed of a copper-containing metallic film that contains copper as a major constituent. Further, side surfaces and bottom surfaces of the electric conductor may be configured to be coated with barrier metal film.

First of all, operations for cutting an electric fuse via the crack assist type process will be described in reference to FIGS. 2A and 2B. In this case, for the purpose of providing an easily comprehensible feature, an electric fuse 20 having a configuration, in which an electric current also flows through a cut part similarly as in the conventional technology, will be illustrated. The electric fuse 20 includes an electric conductor 6, a first terminal 2 and a second terminal 4, which are provided in both ends of the electric conductor 6. Moreover, though it is not shown, the electric conductor 6 may be configured of being formed in an insulating film.

When an electric current having a value of current that is larger than a predetermined value is flowed between the first terminal 2 and the second terminal 4 in the electric fuse 20 of such configuration, a flowing-out region 12, which is formed of the electric conductor 6 being flowed toward outside thereof, is formed. In addition, due to a formation of the flowing-out region 12, the electric conductor 6 rapidly migrates toward a direction to the flowing-out region 12 to form a cut part 14. This causes a cutting of the electric fuse 20.

When such electric fuse 20 is cut, larger quantity of the electric conductor 6 flows into the flowing-out region 12 in the cutting of the electric fuse 20, thereby providing an increased dimension of the cut part 14. This allows maintaining sufficiently larger cut part 14. Therefore, a re-connection or the like can be prevented in the cut electric fuse 20.

Figure 2A:
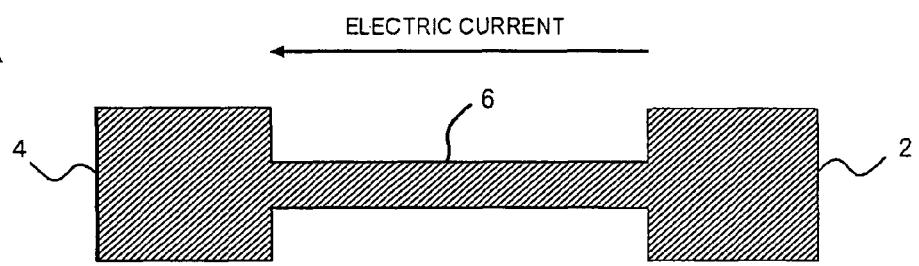
FIGS. 2A and 2B are schematic diagrams, illustrating operations for cutting an electric fuse via a crack assist type process.
Figure 2B:
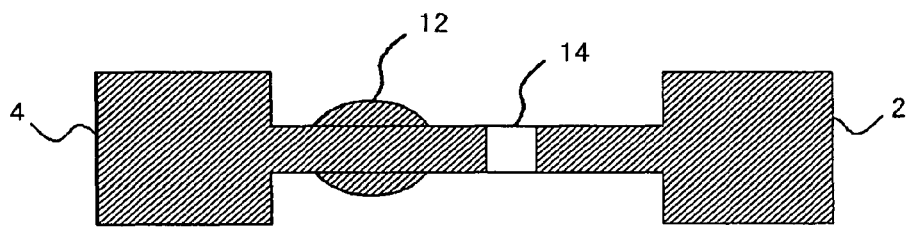

Nevertheless, since the configuration, in which an electric current also flows through the cut part 14 in the configuration shown in FIGS. 2A and 2B, once a lukewarm level of cut part 14 is formed by flowing an electric current between the first terminal 2 and the second terminal 4, and then an attempt to obtain an increased dimension of the cut part 14 by flowing an electric current between the first terminal 2 and the second terminal 4 again is not often successful, as sufficient level of electric current cannot be flowed therein, thereby obstructing a retrial of a cutting operation. On the other hand, according to the present embodiment, by placing the cut spot at a suitable configuration with the operation where the electric fuse 200 is cut via a "crack assist type" process as described above, a retrial of a cutting operation can be obtained.

Figure 3A:
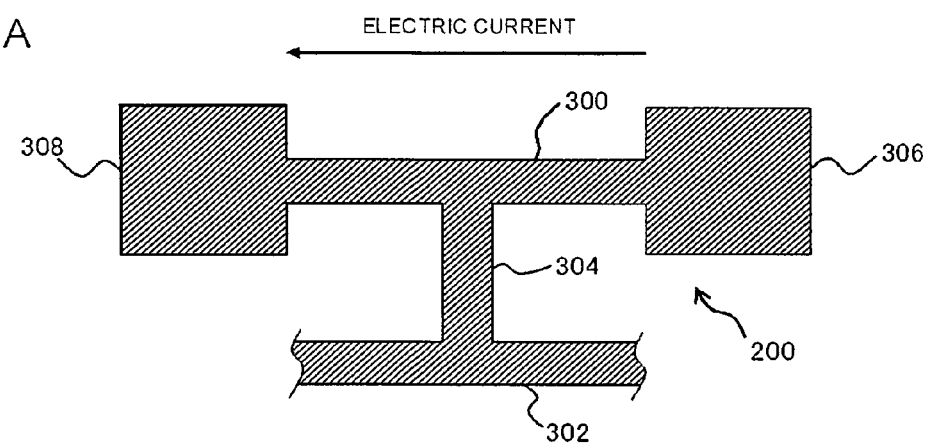
FIGS. 3A and 3B are schematic diagrams, illustrating a configuration of the electric fuse in the embodiment according to the present invention.
Figure 3B:
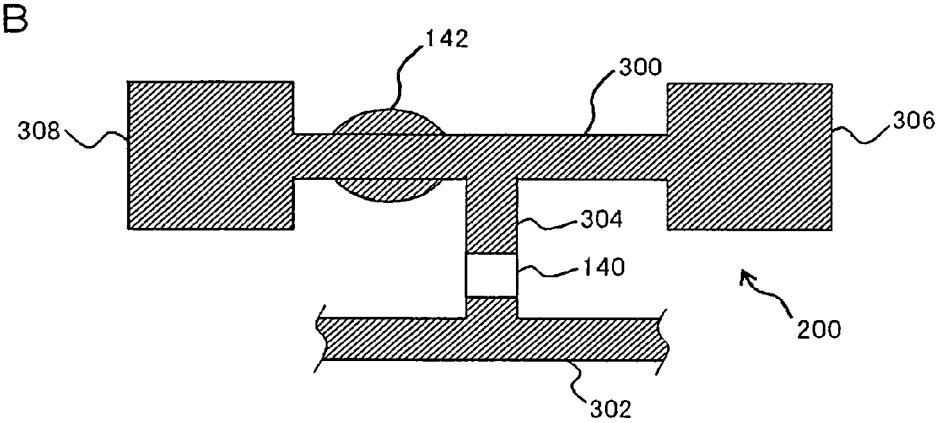

FIGS. 3A and 3B are schematic diagrams, illustrating a configuration of the electric fuse 200 in the present embodiment. FIG. 3A illustrates a condition before cutting the fuse link, and FIG. 3B illustrates a condition after cutting the fuse link. The electric fuse 200 may be configured of being formed in an insulating film (not shown).

In the electric fuse 200, the fuse link 304 is configured of being branched off from the first interconnect 300, and the electric current inflow terminal 306 and the electric current drain terminal 308 are provided in both ends of the first interconnect 300. Moreover, the fuse link 304 may be configured of more easily be cut than the first interconnect 300. For example, the fuse link 304 may be constituted of a via that is capable of coupling the first interconnect 300 with the second interconnect 302. As a typical example, the second interconnect 302, the fuse link 304 and the first interconnect 300 may form a multiple-layered interconnect structure formed by depositing these elements in this sequence. The electric conductor that constitutes the interconnects and the via may be composed of a copper-containing metallic film that contains copper as a major constituent. Further, at least side surfaces of the interconnects and the via may be configured to be coated with barrier metal films.

The electric fuse 200 having such configuration is cut in the following procedure.

(1) Higher voltage is applied between the electric current inflow terminal 306 and the electric current drain terminal 308 to apply an excessive power to the first interconnect 300. This allows the electric conductor constituting the first interconnect 300 being heated.

(2) The heated electric conductor constituting the first interconnect 300 expands to create cracks in the peripheral insulating film and the barrier metal film.

(3) The electric conductor constituting the first interconnect 300 flows out into the cracks in the insulating film and the barrier metal film to form the flowing-out region 142.

(4) Correspondingly, the electric conductor constituting the fuse link 304 is drawn toward the flowing-out region 142. For example, when the fuse link 304 is composed of a via, the volume of the fuse link 304 is smaller than that of the interconnect, and thus the void region 140 can be selectively formed in the fuse link 304. This provides creating a cut part (void region 140) in the fuse link 304, thereby achieving the cutting of the electric fuse 200.

This procedure achieves creating no cut part in the first interconnect 300, even if the void region 140 is formed in the fuse link 304, such that an electric current can be flowed in the first interconnect 300 by applying an electrical voltage between the electric current inflow terminal 306 and the electric current drain terminal 308. This allows applying an electrical potential having same voltage as applied for the first time to the first interconnect 300 over any number of times, thereby ensuring the formation of the void region 140 in the fuse link 304.

Next, a manner for applying an electric voltage to the electric fuse 200 will be described. As described above, in the present embodiment, an excessive power is applied to the first interconnect 300 to form the flowing-out region 142 in the first interconnect 300 and to form the void region 140 in the fuse link 304. In the present embodiment, a voltage of around 2 to 5 Volts, for example, is applied between the electric current inflow terminal 306 and the electric current drain terminal 308. This allows forming the flowing-out region 142 and the void region 140 in the electric fuse 200.

Figure 4:
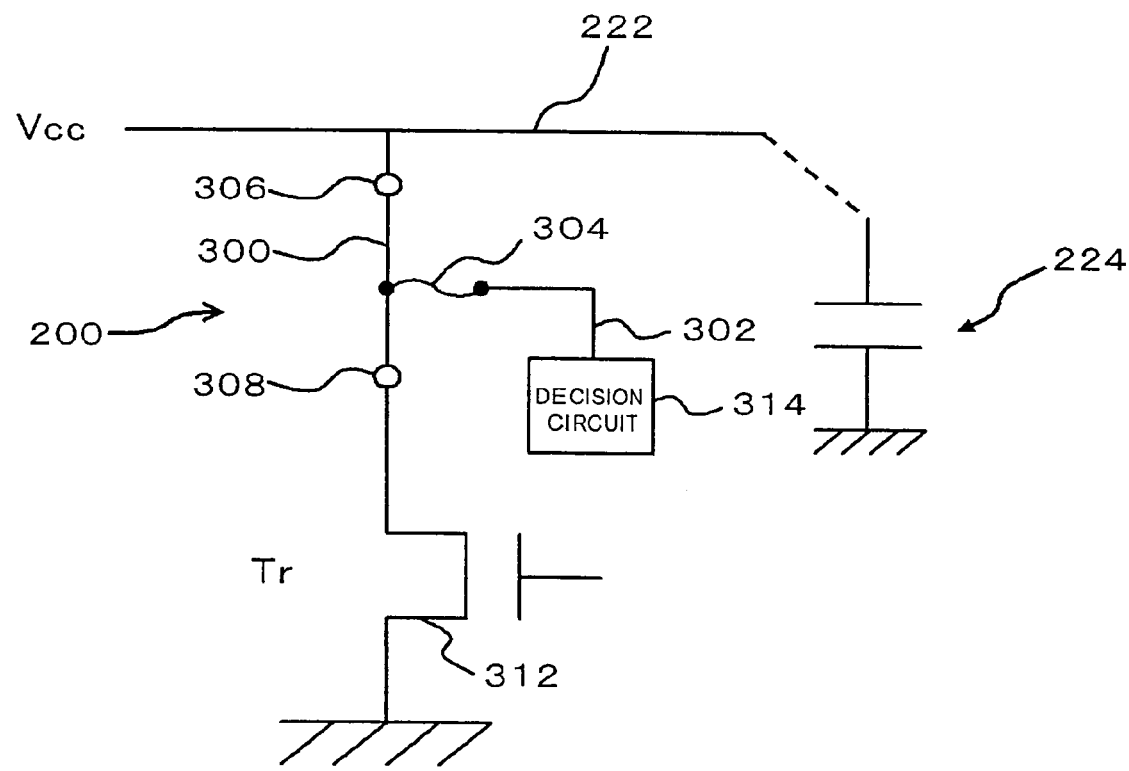
FIG. 4 is a circuit schematic, showing a circuit structure including the electric fuse.

FIG. 4 is a circuit schematic, showing a circuit structure including the electric fuse 200. The current inflow terminal 306 provided in one end of the first interconnect 300 is coupled to a power line 222. The current drain terminal 308 provided in the other end of the first interconnect 300 is coupled to one of a source and a drain of a transistor 312. The other of the source and the drain of the transistor 312 is grounded. Besides, though it is not shown here, a gate of the transistor 312 is coupled to a controlling circuit for selecting the electric fuse 200 to be cut.

One end of the fuse link 304 is coupled to a region between the current inflow terminal 306 and the current drain terminal 308 of the first interconnect 300. The other end of the fuse link 304 is coupled to a decision circuit 314 through the second interconnect 302.

Moreover, though it is not shown here, a plurality of electric fuses 200 having similar configuration are formed on the semiconductor substrate, and a plurality of electric fuses 200 are coupled to the power line 222. Therefore, the power line 222 is in a condition provided with a floating capacitance 224 added thereto. A procedure for cutting the electric fuse 200 in the thus configured circuit will be described.

In the present embodiment, the power line 222 is turned on and the transistor 312 coupled to the electric fuse 200 to be cut is turned on, so that a power supply voltage $V_{CC}$ is applied to the current inflow terminal 306 and the current drain terminal 308 is grounded, thereby allowing to flow an electric current in the first interconnect 300. As a result, as described in reference to FIGS. 3A and 3B, the flowing-out region 142 is formed in the first interconnect 300 and the void region 140 is created in the fuse link 304. Since the first interconnect 300 is not cut in this case, a current can be flowed through the first interconnect 300 over any number of times, leading to enabling a retrial of a cutting operation.

A procedure for determine a cutting condition of the electric fuse 200, which has been thus cut, will be described. A predetermined signal is output from the decision circuit 314 and the power line 222 is grounded. By detecting the conduction with the power line 222 under such condition, a determination on whether the electric fuse 200 of the determination object is cut or not can be achieved.

Figure 5:
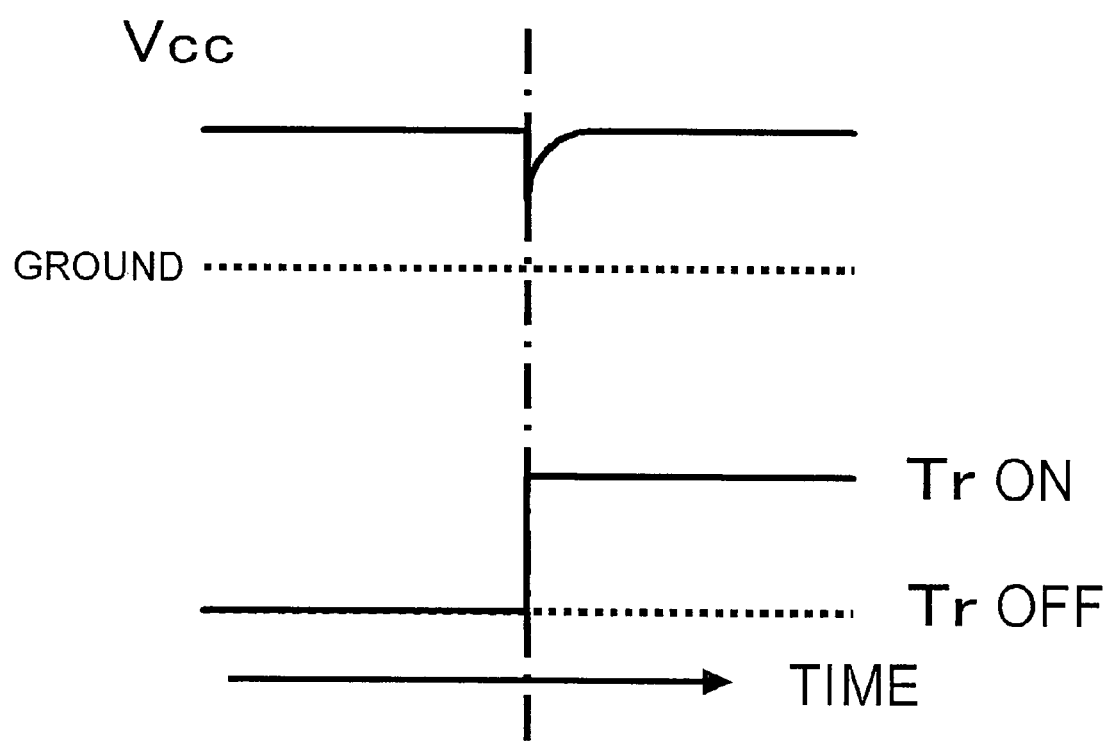
FIG. 5 is a timing chart, illustrating a timing of a transistor being turned on and a condition of an electric potential applied to an electric current inflow terminal.

In addition to above, when the electric fuse 200 is cut, it is preferable that the transistor 312 is turned on, while the power line 222 is turning on. FIG. 5 is a timing chart, illustrating a timing of the transistor 312 being turned on and a condition of an electric potential applied to the current inflow terminal 306. In the chart, a lower solid line indicates a condition of on/off of the transistor 312, and an upper solid line indicates a condition of a potential applied to the current inflow terminal 306. When the transistor 312 is turned on while the power line 222 is turned on, a voltage drop is instantly and temporarily created at a timing when the transistor 312 is turned on, and then, the potential is immediately recovered at $V_{CC}$. Therefore, at a point in time when the transistor 312 is turned on, an electrical voltage $V_{CC}$ is applied between the current inflow terminal 306 and the current drain terminal 308, leading to the situation where an excessive power is applied to the first interconnect 300. This allows forming the flowing-out region 142 by flowing the electric conductor constituting the first interconnect 300 toward outside thereof, and forming the larger void region 140.

In the next, a specific configuration of the electric fuse 200 in the present embodiment will be described. In the present embodiment, the electric fuse 200 is constituted by utilizing a multiple-layered interconnect structure.

Figure 6A:
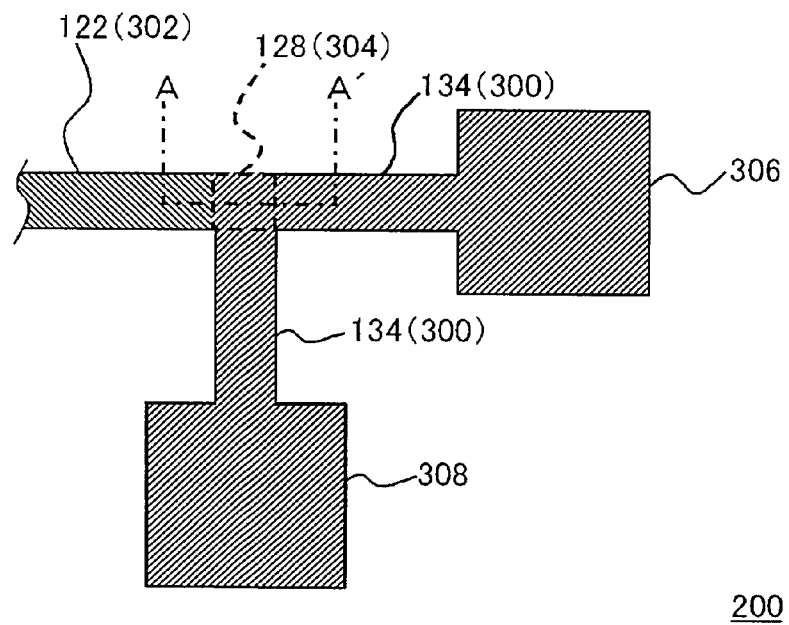
Figure 6A:
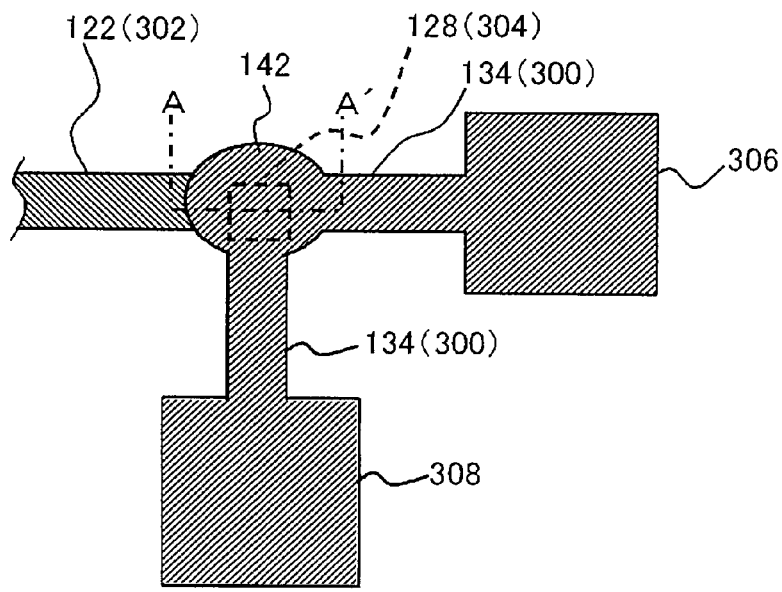

FIGS. 6A and 6B are schematic plan views, showing a configuration of the electric fuse 200 in the present embodiment. FIG. 6A illustrates a condition before cutting the fuse link, and FIG. 6B illustrates a condition after cutting the fuse link. Though an insulating film is not shown here, the electric fuse 200 may be configured of being formed in an insulating film. Here, the second interconnect 302 is formed to serve as a lower layer interconnect 122. The first interconnect 300 is formed to serve as an upper layer interconnect 134. The current inflow terminal 306 and the current drain terminal 308 are formed in the upper layer where the upper layer interconnect 134 is also disposed. The lower layer interconnect 122 is electrically coupled to the upper layer interconnect 134 through a via 128 formed in a layer between the upper layer and the lower layer. The fuse link 304 is composed of the via 128.

The current inflow terminal 306 and the current drain terminal 308 may be formed to have wider widths than the upper layer interconnect 134. As an example, a width of the upper layer interconnect 134 is selected as 0.1 μm, and widths of the current inflow terminal 306 and the current drain terminal 308 may be selected as 0.3 μm. However, since wider linewidth leads to a capability of easily releasing a heat, when the current inflow terminal 306 and the current drain terminal 308 having wider line widths are provided in vicinity of the interconnect for forming the flowing-out region, there may be a fear that the formation of the flowing-out region is difficult and thus the cutting of the electric fuse 200 is difficult. Therefore, when the current inflow terminal 306 and the current drain terminal 308 are formed to have wider widths than the upper layer interconnect 134, the current inflow terminal 306 and the current drain terminal 308 may be provided in locations remote from a flowing-out region and a cut part by certain distances. Further, the current inflow terminal 306 and the current drain terminal 308 may alternatively be formed to have same linewidth as the upper layer interconnect 134.

In the present embodiment, the upper layer interconnect 134 may be configured to have a twisted part, which is twisted in a cross-sectional geometry along a direction in the surface of the semiconductor substrate. In FIGS. 6A and 6B, an exemplary implementation that the upper layer interconnect 134 includes a twisted part twisted to be substantially perpendicular is illustrated. In such configuration, the via 128 is coupled to the upper layer interconnect 134 at the twisted part in the upper layer interconnect 134. When an electric current is flowed through the upper layer interconnect 134, the electric conductor that constitutes the upper layer interconnect 134 is easily heated at the twisted part. Therefore, the flowing-out region 142 is easily formed in vicinity of the twisted part. Therefore, a connection with the via 128 is formed at the twisted part in the upper layer interconnect 134, so that the electric conductor can be easily flowed from the via 128, thereby enabling a formation of the via 128 in the void region 140. Moreover, the connection with the via 128 is formed at the twisted part in the upper layer interconnect 134, so that the electric conductor constituting the via 128 is also heated, thereby allowing an easy flow of the electric conductor from the via 128.

Moreover, an alternative exemplary implementation may be that the upper layer interconnect 134 may be formed to have a linear shape. In this case, when an electric current is flowed through the upper layer interconnect 134, the electric conductor that constitutes the upper layer interconnect 134 is easily heated at a center thereof. Therefore, the via 128 can be coupled with a central portion of the upper layer interconnect 134. This allows forming the void region 140 in the via 128. While the geometry of upper layer interconnect 134 may be selected from various geometries, it is preferable that the via 128 is coupled to a spot that is most easily heated when an electric current is flowed in the upper layer interconnect 134 in any cases.

This allows the electric conductor easily flowing toward the outside thereof in vicinity of the spot to which the via 128 is connected. Therefore, the flowing-out region 142 is formed in the upper layer interconnect 134, and the portion of the electric conductor constituting the via 128 is drawn up toward the flowing-out region 142, thereby forming a void region in the via 128.

Figure 7A:
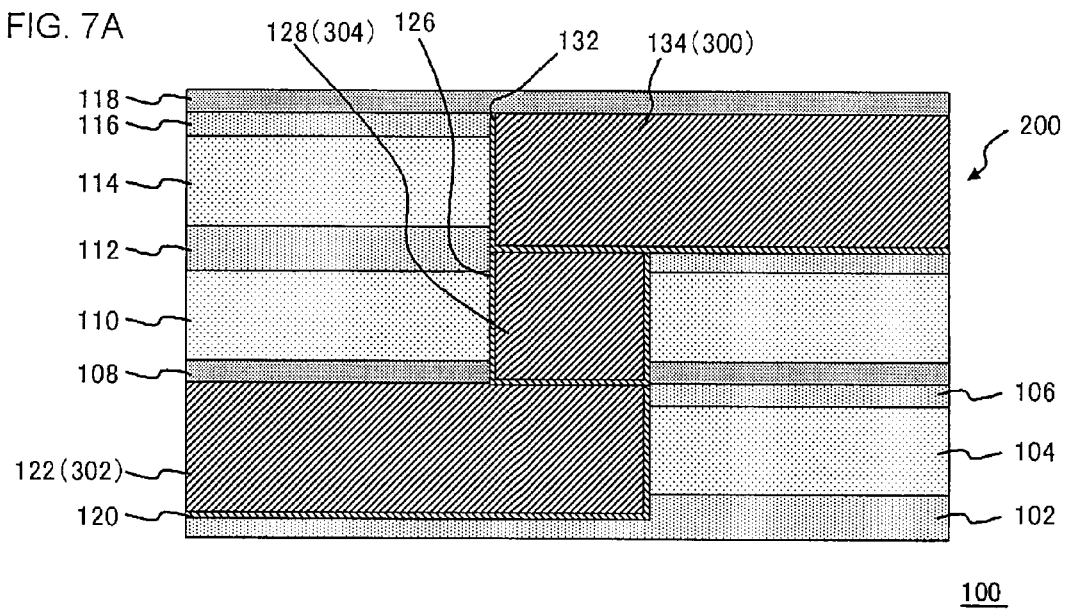
FIGS. 7A and 7B are schematic cross sectional views, showing an example of cross-sectional views along line A-A' in FIGS. 6A and 6B, respectively.
Figure 7B:
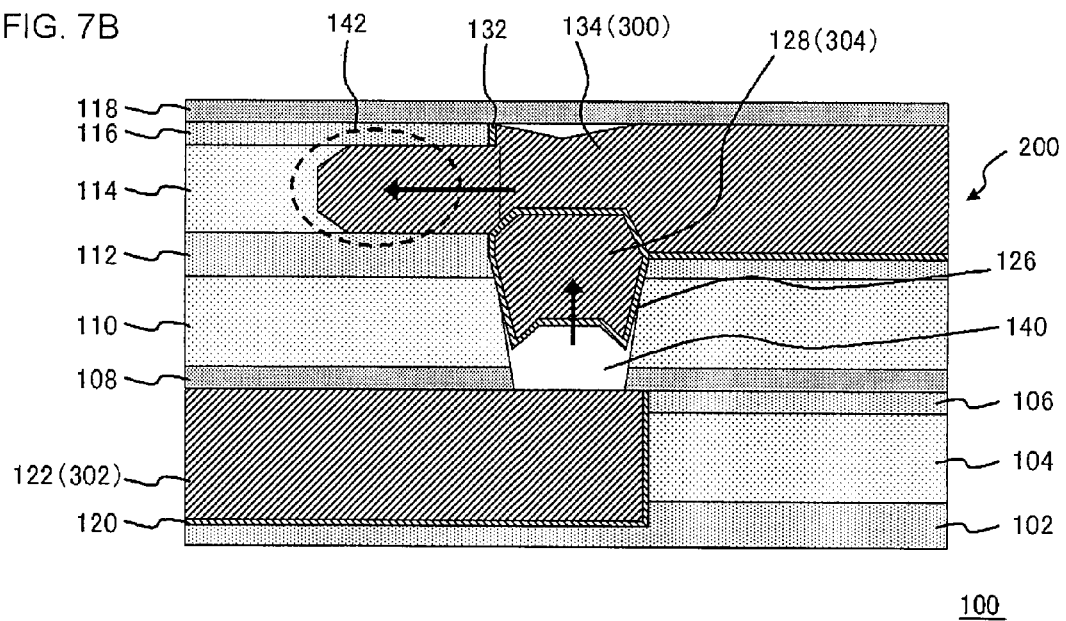

FIGS. 7A and 7B show an example of cross-sectional views along line A-A' appeared in FIGS. 6A and 6B, respectively. FIG. 7A is a cross-sectional view, showing the configuration of semiconductor device 100 before cutting the fuse link, and FIG. 7B is a cross-sectional view, showing the configuration of semiconductor device 100 after cutting the fuse link. In this case, an interconnect structure of a single damascene structure is illustrated.

As shown in FIG. 7A, the semiconductor device 100 includes a semiconductor substrate (not shown), and the following films formed in the following sequences on the semiconductor substrate: a first etch stop film 102; a first interlayer insulating film 104; a first protective film 106; a second etch stop film 108; a second interlayer insulating film 110; a third etch stop film 112; a third interlayer insulating film 114; a second protective film 116; and a fourth etch stop film 118.

In a condition before cutting the fuse link, the electric fuse 200 includes a lower layer interconnect 122, a via 128 electrically coupled to the lower layer interconnect 122 and an upper layer interconnect 134 electrically coupled to the via 128. Here, the lower layer interconnect 122 is formed in the first etch stop film 102, the first interlayer insulating film 104 and the first protective film 106. Further, the via 128 is formed in the second etch stop film 108, the second interlayer insulating film 110 and the third etch stop film 112. Further, the upper layer interconnect 134 is formed in the third etch stop film 112, the third interlayer insulating film 114 and the second protective film 116.

The lower layer interconnect 122, the via 128 and the upper layer interconnect 134 are composed of an electric conductor. The electric conductor may be composed of a copper-containing metallic film containing copper as a major constituent. The copper-containing metallic film may additionally contain silver. Further, the copper-containing metallic film may have a composition additionally containing one or more different element(s) selected from a group consisting of aluminum (Al), gold (Au), platinum (Pt), chromium (Cr), molybdenum (Mo), tungsten (W), magnesium (Mg), beryllium (Be), zirconium (Zn), palladium (Pd), cadmium (Cd), mercury (Hg), silicon (Si), zirconium (Zr), titanium (Ti) and tin (Sn). The copper-containing metallic film may be formed via a plating process, for example. Further, the surface of the copper-containing metallic film may be configured of, for example, provided with a silicide film formed thereon.

Further, the side surfaces and the bottom surfaces of the lower layer interconnect 122, the via 128 and the upper layer interconnect 134 are provided with the first barrier metal film 120, the second barrier metal film 126 and the third barrier metal film 132, respectively, which are provided so as to be in contact with and to cover these interconnects and via. The barrier metal film may be configured to include a refractory metal. The first barrier metal film 120, the second barrier metal film 126 and the third barrier metal film 132 may be composed of, for example, tantalum (Ta), tantalum nitride (TaN), Ti, titanium nitride (TiN), W, tungsten nitride (WN) or the like.

More specifically, in the condition before cutting the fuse link, the second barrier metal film 126 is provided between the lower layer interconnect 122 and the via 128 so as to be in contact therewith. Further, the third barrier metal film 132 is provided between the via 128 and the upper layer interconnect 134 so as to be in contact therewith.

The first interlayer insulating film 104 and the third interlayer insulating film 114 may be composed of a low dielectric constant film such as silicon oxycarbide (SiOC) and the like.

Typical low dielectric constant film includes, in addition to SiOC, poly hydrogen siloxane such as hydrogen silsesquioxane (HSQ), methyl silsesquioxane (MSQ), methylated hydrogen silsesquioxane (MHSQ) and the like, aromatic compound-containing organic materials such as polyarylether (PAE), divinylsiloxane-bis-benzocyclobutene (BCB), SiLK$^{TR}$ (commercially available from Hitachi Chemical Co., Ltd., Tokyo Japan) and the like, silicon oxide glass (SOG), a flowable-oxide (FOX), CYTOP$^{TR}$ (commercially available from Asahi Glass Co., Ltd., Tokyo Japan), or benzo cyclobutene (BCB). Alternatively, a porous film of the above-described material may also be employed for the low dielectric constant film. The first interlayer insulating film 104 and the third interlayer insulating film 114 may be composed of the same material, or may be composed of different materials.

In addition, the second interlayer insulating film 110 may be composed of the material similar as that described above concerning the first interlayer insulating film 104 and the third interlayer insulating film 114. However, in relation to the first interlayer insulating film 104 and the third interlayer insulating film 114, the second interlayer insulating film 110 may preferably be composed of a harder material than the first interlayer insulating film 104 and the third interlayer insulating film 114. For example, the second interlayer insulating film 110 may be composed of a material having higher Young's modulus than that of the first interlayer insulating film 104 and the third interlayer insulating film 114. Such configuration allows easily forming the flowing-out region 142 in the interconnect section, and easily forming the void region 140 in the via 128.

As an exemplary implementation, the second interlayer insulating film 110, in which the via 128 is formed, may be composed of SiOC (Black Diamond, commercially available from Applied Materials Inc., Santa Clara, Calif., USA), and the third interlayer insulating film 114, in which the upper layer interconnect 134 is formed, may be composed of SiOC (Aurora, commercially available from ASM International N.V., Holland). Here, both of the Black Diamond and the Aurora are porous films of SiOC, and the Aurora has lower specific dielectric constant, lower film density and composed of softer film than the Black Diamond.

In addition to above, the configuration of the second interlayer insulating film 110 is not limited to such configuration, and may also be composed of a material similar to that of the first interlayer insulating film 104 and the third interlayer insulating film 114. In such case, since the upper layer interconnect 134 is self-heated by applying an electric current to exhibit a larger level of an expansion while a smaller volume of the conductor of the via 128 provides a smaller level of an expansion due to a thermal conduction is small, the flowing-out region 142 can be selectively formed in the upper layer interconnect 134, and the void region 140 can be selectively formed in the via 128.

The second etch stop film 108 and the fourth etch stop film 118 function as etch stop films utilized in forming the via hole and the interconnect trench, and also function as preventing a diffusion of copper constituting the lower layer interconnect 122 and the upper layer interconnect 134. In addition, these also function as coating films for the electric fuse 200 in the present embodiment. The second etch stop film 108 and the fourth etch stop film 118 may be composed of a harder material than the first interlayer insulating film 104 and the third interlayer insulating film 114. The second etch stop film 108 and the fourth etch stop film 118 may be composed of a material having higher Young's modulus than that of the first interlayer insulating film 104 and the third interlayer insulating film 114. The second etch stop film 108 and the fourth etch stop film 118 may be composed of for example, silicon carbonitride (SiCN), silicon nitride (SiN), silicon carbide (SiC), silicon oxyfluoride (SiOF) or silicon oxynitride (SiON).

The first protective film 106 and the second protective film 116 function as protecting the first interlayer insulating film 104 and the third interlayer insulating film 114, respectively, when the lower layer interconnect 122 and upper layer interconnect 134 are polished via a chemical mechanical polishing (CMP) process. The first protective film 106 and the second protective film 116 may be composed of, for example, silicon dioxide ($SiO_2$) films.

The first etch stop film 102 and the third etch stop film 112 may be composed of the material similar as that of the second etch stop film 108 and the fourth etch stop film 118. In addition, although it is not shown here, each of the first etch stop film 102 and the third etch stop film 112 may also composed of a multiple-layered film including a first insulating film composed of the material similar as that of the second etch stop film 108 and the fourth etch stop film 118, and a second insulating film formed thereon and composed of the material similar as that of the first protective film 106 and the second protective film 116.

In addition to above, the lower layer interconnect 122, the via 128, the upper layer interconnect 134 or the like having the above-described configurations may be formed by the process operation, which is similar to that for forming the ordinary multiple-layered interconnect structure. This allows forming the electric fuse 200 without a need for adding a special operation, As described above, for example, it may be configured that a periphery of the upper layer interconnect 134 is covered with a coating film such as the third barrier metal film 132 and the fourth etch stop film 118, and that the third interlayer insulating film 114 composed of a material that is softer than the coating film is further formed in the periphery thereof.

Next, a procedure for cutting the electric fuse 200 having such configuration will be described. When a predetermined voltage is applied across the current inflow terminal 306 and the current drain terminal 308 to apply an excessive power to the upper layer interconnect 134, the electric conductor constituting the upper layer interconnect 134 expands, so that it expands toward a direction to the third interlayer insulating film 114, which is composed of a soft film. Due to the expansion of such electric conductor, a crack is generated in the third barrier metal film 132 or the like, so that the electric conductor that constitutes the upper layer interconnect 134 flows into the third interlayer insulating film 114 from the crack. More specifically, the electric conductor that constitutes the upper layer interconnect 134 flows out of the interconnect trench. This achieves forming the flowing-out region 142, as shown in FIG. 7B.

Further, since the electric conductor rapidly migrates toward the flowing-out region 142, the electric conductor is cut at the spot where the migration of the electric conductor can not keep up with other portions. In the present embodiment, the electric conductor is cut at the location of the via 128, thereby forming the void region 140. According to such mechanism, the flowing-out region 142 and the void region 140 are formed in the locations, which are spaced apart from each other. Moreover, since the upper layer interconnect 134 is not cut, an electric current can be flowed through the upper layer interconnect 134 over any number of times even after the void region 140 is formed in the via 128, allowing a retrial of an operation for cutting.

In addition, since the second barrier metal film 126 is provided between the via 128 and the lower layer interconnect 122 in the present embodiment, the second barrier metal film 126 is easily peeled off from the lower layer interconnect 122, such that the void region 140 is easily formed between the second barrier metal film 126 and the lower layer interconnect 122.

Further, in the condition after cutting the fuse link, the electric conductor that constitutes the via 128 migrates together with the second barrier metal film 126, thereby forming the void region 140 between the second barrier metal film 126 and lower layer interconnect 122. Therefore, even if a thermal processing is conducted after such process, a re-connection with the lower layer interconnect 122, which is otherwise caused by a re-migration of the electric conductor composed of a copper-containing metallic film, can be avoided by the presence of the second barrier metal film 126. This allows providing an improved thermal resistance of the semiconductor device 100. Since the second barrier metal film 126 and the third barrier metal film 132 are provided to form a double-layered structure between the flowing-out region 142 and the void region 140, the migration of electric conductor can be further prevented.

While the above embodiment illustrates the exemplary implementation, in which a crack is created in the third barrier metal film 132 or the like, when the upper layer interconnect 134 is heated to be expanded, the fourth etch stop film 118 may be peeled off from the upper layer interconnect 134 or the second protective film 116, thereby creating a gap between these films. In such case, the electric conductor constituting the upper layer interconnect 134 flows into the gap to form the flowing-out region 142. Even in such case, the electric conductor migrates toward the flowing-out region 142, so that the cut part 214 is formed in the via 128.

Figure 8A:
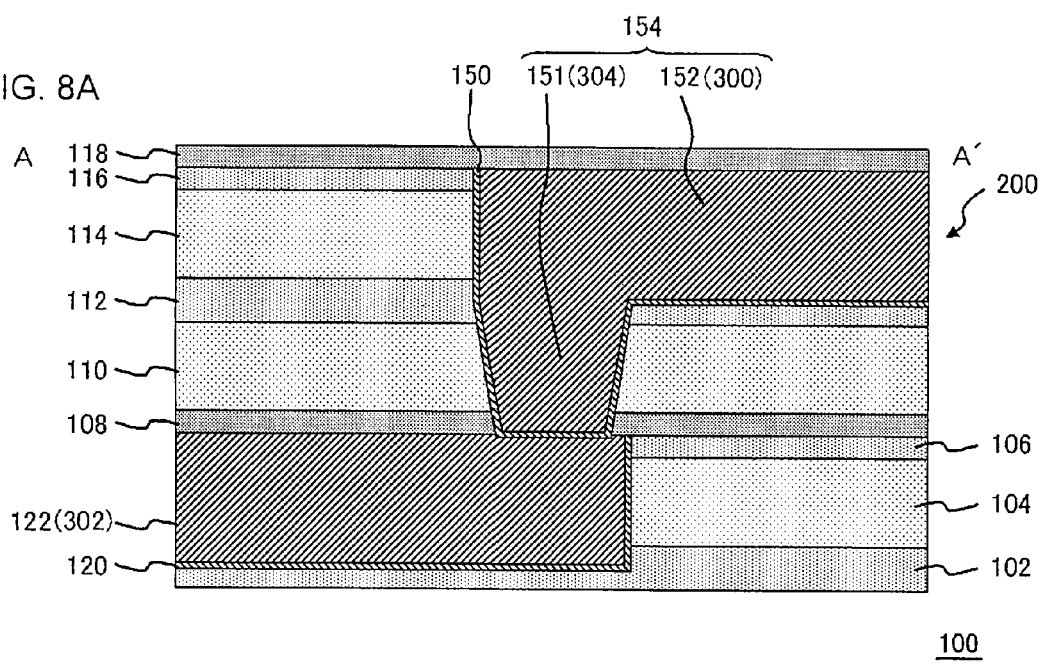
FIGS. 8A and 8B are diagrams, showing cross-sectional views along line A-A' in FIGS. 6A and 6B, respectively.
Figure 8B:
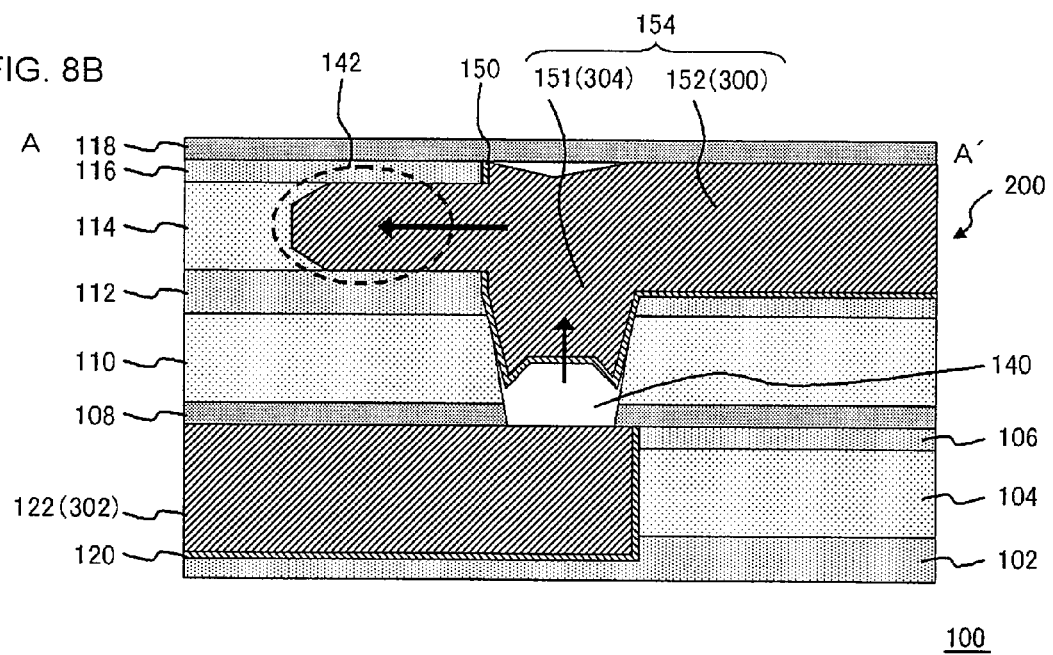
Figure 9:
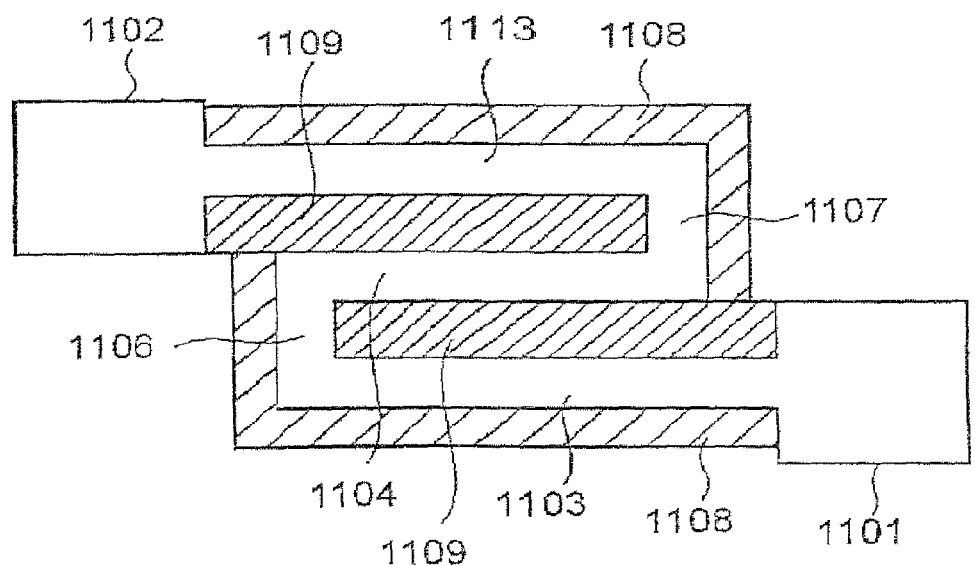
FIG. 9 is a plan view, showing an example of a conventional electric fuse.

FIGS. 8A and 8B are diagrams, showing another example of cross-sectional views along line A-A' of FIGS. 6A and 6B, respectively. FIG. 8A is a cross-sectional view, showing a configuration of the semiconductor device 100 before cutting the fuse link, and FIG. 8B is a cross-sectional view, showing a configuration of the semiconductor device 100 after cutting the fuse link.

In this case, the configuration is different from the exemplary implementation shown in FIGS. 7A and 7B, in terms of the interconnect structure having a dual damascene structure. The upper layer interconnect 134 and the via 128 in FIGS. 6A and 6B correspond to the upper layer interconnect 152 and the via 151, respectively. Further, a via 151 (fuse link 304) and an upper layer interconnect 152 (first interconnect 300) are integrally formed to constitute a dual damascene interconnect 154. The via 151 is formed in the second etch stop film 108, the second interlayer insulating film 110 and the third etch stop film 112. In addition, the upper layer interconnect 152 is formed in the third etch stop film 112, the third interlayer insulating film 114 and the second protective film 116.

The via 151 and the upper layer interconnect 152 may be also composed of the material similar as that of the via 128 and the upper layer interconnect 134. In addition, the dual damascene interconnect 154 is configured that the side surfaces and the bottom surface thereof are covered with a fifth barrier metal film 150. The fifth barrier metal film 150 may also be composed of the material similar as that of the second barrier metal film 126, the third barrier metal film 132 or the like. In the condition before cutting the fuse link, the fifth barrier metal film 150 is provided between the via 151 and the lower layer interconnect 122 so as to be in contact therewith.

When an excessive electric power is applied to the upper layer interconnect 152 in the electric fuse 200 having the above-described configuration, the electric conductor constituting the upper layer interconnect 152 expands, so that it expands toward a direction to the third interlayer insulating film 114, which is composed of a soft film. Due to the expansion of such electric conductor, a crack is generated in the fifth barrier metal film 150 or the like, so that the electric conductor that constitutes the upper layer interconnect 152 flows into the third interlayer insulating film 114 therefrom. This achieves forming the flowing-out region 142, as shown in FIG. 8B.

Further, since the electric conductor rapidly migrates toward the flowing-out region 142, the electric conductor is cut at the spot where the migration of the electric conductor can not keep up with other portions. In the present embodiment, the electric conductor is cut at the location of the via 151, thereby forming the void region 140. In addition, since the fifth barrier metal film 150 is provided between the via 151 and the lower layer interconnect 122 in the present embodiment, the fifth barrier metal film 150 is easily peeled off from the lower layer interconnect 122, such that the void region 140 is easily formed between the fifth barrier metal film 150 and the lower layer interconnect 122.

Further, in the condition after cutting the fuse link, the electric conductor that constitutes the via 151 migrates together with the fifth barrier metal film 150, thereby forming the void region 140 between the fifth barrier metal film 150 and lower layer interconnect 122. Therefore, even if a thermal processing is conducted after such process, a re-connection with the lower layer interconnect 122, which is otherwise caused by a re-migration of the electric conductor composed of a copper-containing metallic film, can be avoided by the presence of the fifth barrier metal film 150. This allows providing an improved thermal resistance of the semiconductor device 100.

Since the electric fuse 200 is composed of the multiple-layered interconnect structure according to the semiconductor device 100 including the electric fuse 200 in the present embodiment as described above, these can be arranged in the layered direction, thereby achieving a reduced area for forming the electric fuse.

In addition, since the via is cut, a probability of causing the re-connection of the electric conductor after the cutting can be reduced.

Further, if the electric fuses 200 are formed in one surface, there is a fear that the flowing-out region 142 may be possibly formed to bridge across the electric conductors, which otherwise should be electrically cut. When such phenomenon is caused, the cut electric fuse would be coupled to the flowing-out region 142, for example, thereby causing a reduced cutting yield (reduced resistance after the cutting), or an increased variation in the resistance after the cutting (variation with time). Since the void region 140 serving as a cut part and the flowing-out region 142 are formed in different layers in the present embodiment, such problem of creating a bridge can also be prevented.

Further, since the electric current for cutting the fuse link 304 flows through the first interconnect 300, which is different from the cut part according to the electric fuse 200 in the present embodiment, retrials of the cutting operation can be conducted over any number of times, thereby ensuring the cutting of the fuse link 304.

It is to be understood that the invention is capable of using in various other combinations, modifications and environments, and any other interchanges in the expression between the method and device or the like according to the present invention may be effective as an alternative of an embodiment according to the present invention.

While the exemplary implementation of utilizing the via for the fuse link 304 has been described, the fuse link 304 may alternatively be composed of an interconnect, for example. In such case, for example, the fuse link 304 may have a width narrower than that of the first interconnect 300, thereby providing an improved cutting-ability of the fuse link 304.

It is apparent that the present invention is not limited to the above embodiment, and may be modified and changed without departing from the scope and spirit of the invention.

What is claimed is:

1. A semiconductor device, comprising:
   a semiconductor substrate;
   a first interconnect and a second interconnect, formed on said semiconductor substrate;
   a fuse link, formed on said semiconductor substrate and provided so that one end thereof is coupled to said first interconnect, said fuse link connecting said first interconnect and said second interconnect and being configured to electrically disconnect said second interconnect from said first interconnect; and
an electric current inflow terminal and an electric current drain terminal for cutting said fuse link, formed on said semiconductor substrate and directly physically connected to one end and another end of said first interconnect, respectively.

2. The semiconductor device as set forth in claim 1, further comprising a void region formed in said fuse link, and a flowing-out region formed of an electric conductor constituting said first interconnect flowing in a direction away from a periphery of said first interconnect and away from said void region, in a condition after said cutting said fuse link.

3. The semiconductor device as set forth in claim 2, wherein said first interconnect and said second interconnect are formed in different layers and said fuse link is configured of a via formed in a layer between said first interconnect and said second interconnect, wherein said via is coupled to said first interconnect and said second interconnect, in a condition before said cutting said fuse link, and wherein a void region is formed between said second interconnect and said via or in said via, in said condition after said cutting said fuse link.

4. The semiconductor device as set forth in claim 3, wherein said first interconnect, said second interconnect and said via are composed of a copper-containing metallic film containing copper as a major constituent, wherein said semiconductor device further comprises a first barrier metal film between said second interconnect and said via such that said first barrier metal film is provided in contact with said second interconnect and said via, in said condition before said cutting said fuse link, and wherein said void region is formed between said first barrier metal film and said second interconnect, in said condition after said cutting said fuse link.

5. The semiconductor device as set forth in claim 4, further comprising a second barrier metal film on a side surface of said first interconnect such that said second barrier metal film is provided in contact with said first interconnect, in said condition before said cutting said fuse link, and wherein a crack is created in said second barrier metal film and said flowing-out region is formed of said electric conductor flowed from said crack, in said condition after said cutting said fuse link.

6. The semiconductor device as set forth in claim 3, further comprising an insulating layer formed in peripheries of said first interconnect, said second interconnect and said fuse link on said semiconductor substrate,
wherein said insulating layer includes a first insulating layer portion formed in a periphery of said via and a second insulating layer portion formed in a periphery of said first interconnect, said second insulating layer portion having a Young's modulus lower than that of said first insulating layer portion.

7. The semiconductor device as set forth in claim 3, further comprising an insulating layer formed in peripheries of said first interconnect, said second interconnect and said fuse link on said semiconductor substrate,
wherein said insulating layer includes a first insulating layer portion formed in a periphery of said via and a second insulating layer portion formed in a periphery of said first interconnect, said second insulating layer portion having a film density lower than that of said first insulating layer portion.

8. The semiconductor device as set forth in claim 3, further comprising an insulating layer formed in peripheries of said first interconnect, said second interconnect and said fuse link on said semiconductor substrate,
wherein said insulating layer includes a first insulating layer portion formed in a periphery of said via and a second insulating layer portion formed in a periphery of said second interconnect, said second insulating layer portion having a dielectric constant lower than that of said first insulating layer portion.

9. The semiconductor device as set forth in claim 6, wherein said first interconnect is formed in an interconnect trench formed in said second insulating layer portion, and said flowing-out region is formed of said electric conductor flowed outside of said interconnect trench.

10. The semiconductor device as set forth in claim 7, wherein said first interconnect is formed in an interconnect trench formed in said second insulating layer portion, and said flowing-out region is formed of said electric conductor flowed outside of said interconnect trench.

11. The semiconductor device as set forth in claim 8, wherein said first interconnect is formed in an interconnect trench formed in said second insulating layer portion, and said flowing-out region is formed of said electric conductor flowed outside of said interconnect trench.

12. The semiconductor device as set forth in claim 3, wherein said first interconnect includes a twisted part, which is twisted in a cross-sectional geometry along a direction in the surface of said semiconductor substrate, and said via is coupled to the first interconnect at said twisted part in said first interconnect.

13. The semiconductor device as set forth in claim 2, further comprising an insulating layer formed in peripheries of said first interconnect, said second interconnect and said fuse link on said semiconductor substrate,
wherein said first interconnect is formed in an interconnect trench formed in said insulating layer, and said flowing-out region is formed of said electric conductor flowing outside of said interconnect trench.

14. The semiconductor device as set forth in claim 3, further comprising an insulating layer formed in peripheries of said first interconnect, said second interconnect and said fuse link on said semiconductor substrate,
wherein said first interconnect is formed in an interconnect trench formed in said insulating layer, and said flowing-out region is formed of said electric conductor flowing outside of said interconnect trench.

15. The semiconductor device as set forth in claim 1, wherein said fuse link is coupled to a decision circuit through said second interconnect, said decision circuit being capable of deciding a status whether the fuse is cut or not.

16. The semiconductor device as set forth in claim 1, wherein an electric current path for cutting of said fuse link is exclusively provided between said electric current inflow terminal and said electric current drain terminal without passing through said fuse link and without passing between said fuse link and said second interconnect.

17. The semiconductor device as set forth in claim 2, further comprising a second barrier metal film covering said first interconnect, wherein said flowing-out region is formed of said electric conductor constituting said first interconnect flowing out toward outside of a region covered by said second barrier metal film.

* * * * *